(12) United States Patent
Ishikawa

(10) Patent No.: US 7,759,998 B2
(45) Date of Patent: Jul. 20, 2010

(54) TIMING ADJUSTMENT CIRCUIT

(75) Inventor: Toru Ishikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 802 days.

(21) Appl. No.: 11/698,892

(22) Filed: Jan. 29, 2007

(65) Prior Publication Data

US 2007/0176658 A1 Aug. 2, 2007

(30) Foreign Application Priority Data

Jan. 30, 2006 (JP) .............................. 2006-020782

(51) Int. Cl.
*H03H 11/26* (2006.01)
(52) U.S. Cl. .................................................... 327/261
(58) Field of Classification Search .................. 327/261, 327/276, 284
See application file for complete search history.

(56) References Cited

U.S. PATENT DOCUMENTS 6,252,445 B1 * 6/2001 Eidson ........................ 327/172
6,294,944 B1 * 9/2001 Shiochi et al. ............... 327/333
6,329,858 B1 * 12/2001 Sobue ......................... 327/231
6,909,315 B2 * 6/2005 Carnevale et al. ............ 327/261
7,321,250 B2 * 1/2008 Tokuyama et al. ........... 327/261

FOREIGN PATENT DOCUMENTS

| JP | 099/46687 | 9/1999 |
|---|---|---|
| JP | 2001-126471 | 5/2001 |
| JP | 2003-099321 | 4/2003 |

* cited by examiner

*Primary Examiner*—Hai L Nguyen
(74) *Attorney, Agent, or Firm*—Young & Thompson

(57) ABSTRACT

Three flip-flops receive a common data signal input through a data terminal based on different timing signals which are obtained from an external timing signal and differ from one another by a specific delay step. A judging circuit judges whether or not the output data of the three flip-flops coincide with one another. If all the output data coincide with one another, the latch timing is maintained, whereas if the output data of the flip-flop latching the data signal at a fastest or latest timing differs from the output data of the flip-flop latching the data signal at the central timing, the judging circuit changes the variable timing to obtain a suitable latch timing.

11 Claims, 9 Drawing Sheets

A=B=C HOLD DELAY

A=B≠C DECREASE DELAY

A≠B=C INCREASE DELAY

TIMING ADJUSTMENT CIRCUIT

BACKGROUND OF THE INVENTION

1. Field of the Invention

The present invention relates to a timing adjustment circuit and a semiconductor device. More particularly, the present invention relates to a timing adjustment circuit for adjusting timing between a data signal and a clock signal that determines the timing of latching the data signal. The present invention also relates to a semiconductor device having such a timing adjustment circuit.

2. Description of the Related Art

Semiconductor memory products, such as a DDR (double-data-rate) DRAM device, use a data strobe signal DQS (or DQSB) input to a DQS terminal as an input clock signal for fetching or latching a data signal DQ input through a DQ terminal. Such semiconductor memory products are accompanied by a problem that the input setup time (tS) and the hold time (tH) for the latching are degraded due to varied delays of rising edges and falling edges of the internal clock generated from the DQS signal as well as due to the delay of the transmitting-side device. Techniques for avoiding this problem and improving the operational tolerance for the setup time and the hold time defined for an input data signal include the technique described in Patent Publication JP-2001-126481A.

FIG. 8 of the accompanying drawings is a schematic circuit diagram of a semiconductor integrated circuit described in JP-2001-126481A. Referring to FIG. 8, a data strobe signal input from a DQS terminal 201 is then input to a latch-signal generation circuit 235 by way of an input circuit 204, and the latch-signal generation circuit 235 generates a latch signal SA for a 0°-edge (rising edge) and a latch signal SB for a 180°-edge (falling edge). A data signal input from a DQ terminal 202 is then input to a delay circuit 228 by way of an input circuit 219, and the delay circuit 228 delays the data signal by a predetermined time period before it outputs a to-be-latched signal SC. The to-be-latched signal SC is then latched by a S-flip-flop 232 for a 0°-edge by means of latch signal SA and then by a S-flip-flop 233 for a 180°-edge by means of latch signal SB.

A latch-signal generation-control circuit 236 controls latch-signal generation circuit 235. The latch-signal generation-control circuit 236 has an oscillation circuit 269, and the signal SD and the inverted signal /SD generated by the oscillation circuit 269 are input to dummy-latch-signal generation circuits 271, 273 by way of dummy input circuits 270, 272 respectively. A comparator circuit 274 receives, as inputs thereof, the dummy latch signal DSA generated by the dummy-latch-signal generation circuit 271 and corresponds to the latch signal SA, and the dummy latch signal DSB generated by the dummy-latch-signal generation circuit 273 and corresponds to the latch signal SB. The comparator circuit 274 outputs control signals H1 through H3 and L1 through L3 to the dummy-latch-signal generation circuits 271, 273, respectively, based on the result of the comparison so as to allow their rising timings to match with each other. The control signals H1 through H3 and L1 through L3 are also input to the latch-signal generation circuit 235, whereby the rising edge of the latch signal SA and the rising edge of the latch signal SB are equalized.

Techniques for adjusting timing between a data strobe signal and a data signal include the technique described in Patent Publication JP-2003-99321A. With this technique, a known data is written at a specific address of a memory from a memory controller at the time of initializing the memory system and then read out, while changing the delay time of the data strobe signal. Thereafter, the read out data and the written data are compared against each other to determine the range of delay time where a data can be read out correctly. Then, an intermediate value in the range of delay time as determined in the manner as described above is defined as a delay time of the data strobe signal upon reading the data by the memory controller. According to the JP-2003-99321A, it is possible to optimally define the delay time of a data strobe signal with this arrangement so that a read-in data can be accurately latched within a readable time range.

Patent Publication PCT-WO99/46687 describes a technique of comparing a reference signal and a data signal for the phase difference at the data receiving side for the transmission of parallel data, and the data transmitting side adjusts the delay time based on the phase difference. FIG. 9 of the accompanying drawings is a schematic circuit diagram of the data transmission apparatus described in PCT-WO99/46687. Referring to FIG. 9, a simultaneous-arrival 20 judging circuit 326 of a receiver RCV detects the range of variation of data arrivals from a 4-bit data and transmits the result of detection to a delay-time adjustment circuit 306 of a driver DRV. The delay-time adjustment circuit 306 adjusts the delay times of the delay circuits 301 through 304 by individually advancing or delaying, whichever appropriate, the starting time of a signal showing a late or early arrival time, thereby allowing the signals DQ0 through DQ3 to reach the receiver RCV at the same time.

According to the technique of JP-2001-126481A, the difference of delay between the rising edge and the falling edge is compensated; however, the adjustment of the delay time relative to the delay circuit 228 is not conducted. The technique of PCT-WO99/46687 involves a problem that a data has to be read out repeatedly from the memory when determining the range of delay time for correctly reading the data signal, thereby causing that the adjustment operation is time consuming. Additionally, if this technique is applied to an operation of adjusting a strobe signal when latching a data to be written at the memory side, a known data needs to be used as the data signal to be written for the purpose of judging whether or not the data can be written correctly. Therefore, the delay time of the strobe signal cannot be dynamically adjusted by this technique while allowing the memory to be actually operated.

The technique described in PCT-WO99/46687 is used for adjusting the phase difference between parallel data, and thus not for adjusting the phase difference between the data strobe signal and the data signal. Furthermore, with the technique of PCT-WO99/46687, a receiver for detecting the phase difference between data signals and a driver for adjusting the delay time so as to eliminate the detected phase difference have to be combined together for operation. In other words, the phases of parallel data cannot be adjusted by the receiver alone. Therefore, when a known driver (memory control circuit) is used, it is not possible for the receiver (memory device) to adjust the phases of parallel data. This fact means the disadvantage of the described technique in lacking a broad applicability.

In view of the above-described problems of the conventional techniques, it is an object of the present invention to provide a timing adjustment circuit that can dynamically adjust the phase difference between the data signal and the timing signal for latching the data signal only at the data receiving-side device.

It is another object of the present invention to provide a semiconductor device having such a timing adjustment circuit.

The present invention provides a timing adjustment circuit for controlling timing for latching a data signal based on an external timing signal, the timing adjustment circuit including: a variable delay circuit for delaying the external timing signal by a variable delay time to generate a delayed timing signal; a first latch circuit for latching the data signal based on a first clock signal having a specific phase relationship with respect to the delayed timing signal; a second latch circuit for latching the data signal based on a second clock signal having a first delay time with respect to the first clock signal; a third latch circuit for latching the data signal based on a third clock signal having a second delay time with respect to the first clock signal, the second delay time being larger than the first delay time; and a judging circuit for comparing output data of the first through third latch circuits among each other, to control the variable delay time based on a result of comparison.

In the timing adjustment circuit of the present invention, three latch circuits latch the data signal at the respective timings which have a specific phase relationship with respect to the delayed timing signal, the data of the data signal thus latched are compared against one another, and result of the comparison is used for changing the delay time for the delayed timing signal. If the setup time and hold time are suitably set for the data signal with respect to the external timing signal, the data of the outputs of the three latch circuits coincide with one another without adjusting the variable delay time; and if not, the variable delay time is adjusted until the three data coincide with one another for assuring the suitable setup time and hold time.

The specific phase relationship between the delayed timing signal and the first through third clock signals may be selected as desired. For example, the delayed timing signal may be used as the first clock signal.

The present invention also provides a semiconductor device including the timing adjustment circuit of the present invention, and an internal circuit for receiving the output data of the second latch circuit. The semiconductor device may be a DRAM device.

The present invention also provides a semiconductor device including a data terminal, a first timing adjustment circuit configured by the timing adjustment circuit of the present invention, and a second timing adjustment circuit configured by the timing adjustment circuit of the present invention, wherein the first timing adjustment circuit latches a first data signal based on a rising edge of the external timing signal and the second timing adjustment circuit latches a second data signal based on a falling edge of the external timing signal. The semiconductor device may be a DDR DRAM device.

The above and other objects, features and advantages of the present invention will be more apparent from the following description, referring to the accompanying drawings.

DETAILED DESCRIPTION OF THE PREFERRED EMBODIMENTS

Figure 1:
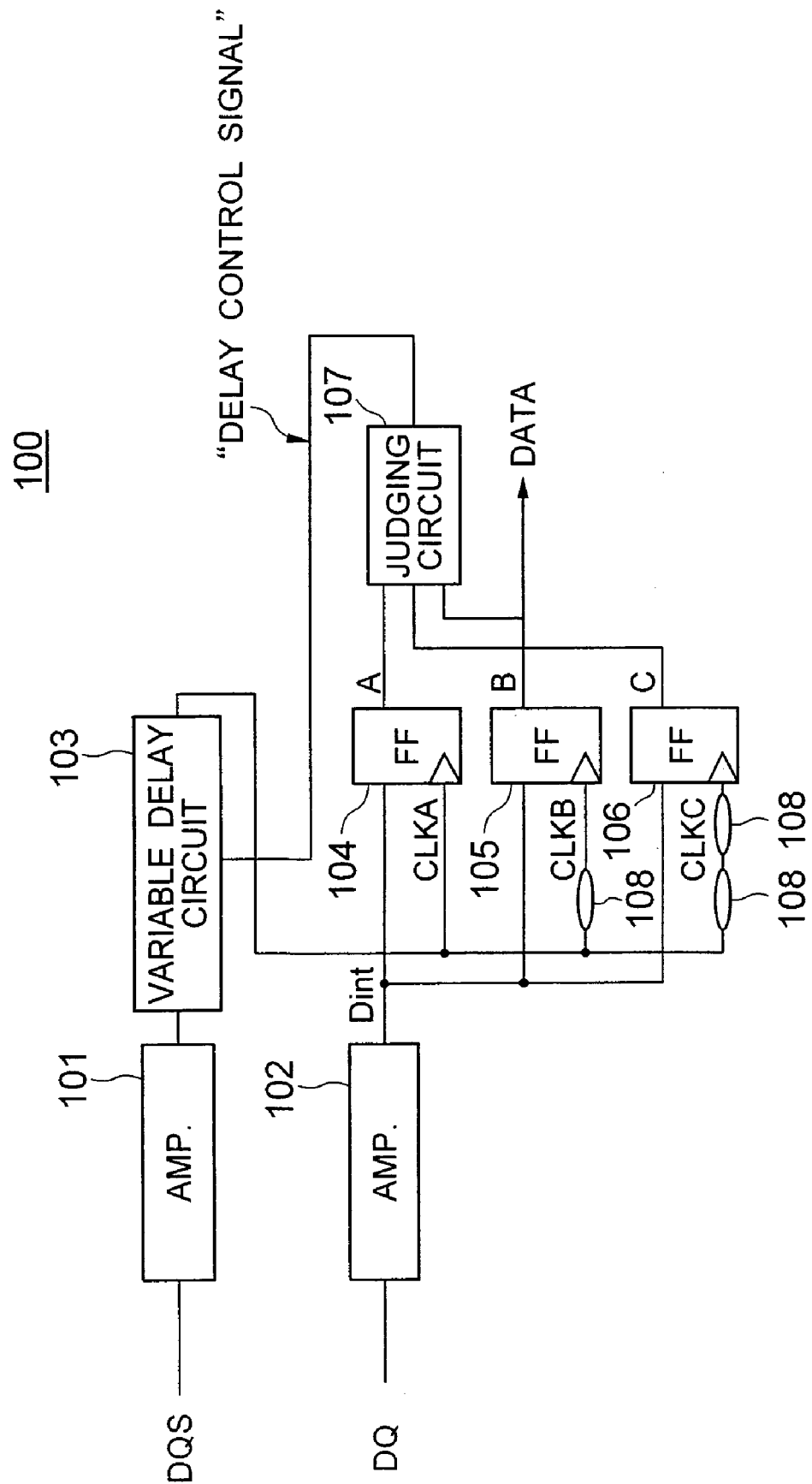
FIG. 1 is a schematic block diagram of a timing adjustment circuit according to an embodiment of the present invention.

Now, the present invention will be described in more detail by referring to the accompanying drawings that illustrate preferred embodiments of the present invention. FIG. 1 is a schematic block diagram of a timing adjustment circuit in a semiconductor device according to the embodiment of the present invention.

The semiconductor device of FIG. 1 is configured as a memory device 100 that includes input amplifiers 101, 102, a delay adjustment circuit (variable delay circuit) 103, first through third latch circuits (flip-flops) 104 through 106, a judging circuit 107 and a plurality of delay gates 108. A data strobe signal or DQS signal used as an external clock signal is input through a DQS terminal, and then input to the delay adjustment circuit 103 by way of input amplifier 101. The delay adjustment circuit 103 can adjust a delay time at least in three steps of adjustment and outputs the input clock signal after delaying the same.

A first clock signal having a predetermined phase relationship relative to the delayed timing signal output from the delay adjustment circuit 103 is input to the clock terminal of the first flip-flop 104. In the instance of FIG. 1, the first clock signal (CLKA) having a phase same as that of the delayed timing signal from the delay adjustment circuit 103 is input to the clock terminal of the first flip-flop 104. A second clock signal (CLKB) obtained by delaying the first clock signal CLKA input to the first flip-flop 104 by means of a single delay gate 108 is input to the clock terminal of the second flip-flop 105. A third clock signal (CLKC) obtained by delaying the first clock signal CLKA input to the first flip-flop 104 by means of two delay gates 108 is input to the clock terminal of the third flip-flop 106. The third clock signal CLKC may be produced by delaying the second clock signal CLKB input to the second flip-flop 105 by means of delay gate 108.

Assuming that the delay time of the delay gates 108 is td, the second clock signal CLKB input to the second flip-flop 105 is delayed by td from the first clock signal CLKB input to the first flip-flop 104. The clock signal CLKC input to the third flip-flop 106 is delayed by td×2 from the first clock signal CLKB input to the first flip-flop 104. The data signal DQ input through a DQ terminal is input to the data input terminals of the first through third flip-flops 104 through 106 by way of input amplifier 102 and each of the flip-flops 104 through 106 latches the data signal Dint that input amplifier 102 outputs based on the clock signal input thereto. As a result, the input data is latched at three different timings by the flip-flops 104 through 106.

The judging circuit 107 receives the outputs of the flip-flops 104 through 106 each time a data signal is input thereto and compares the outputs (signals A, B, C) of the flip-flops against each other. Then, the judging circuit 107 delivers a delay control signal to the delay adjustment circuit 103. The delay adjustment circuit 103 prolongs, shortens or maintains the current delay time based on the delay control signal that the judging circuit 107 outputs. The signal B that the second flip-flop 105 latches is transmitted to an internal circuit (not shown) as an internal data signal DATA.

Figure 2A:
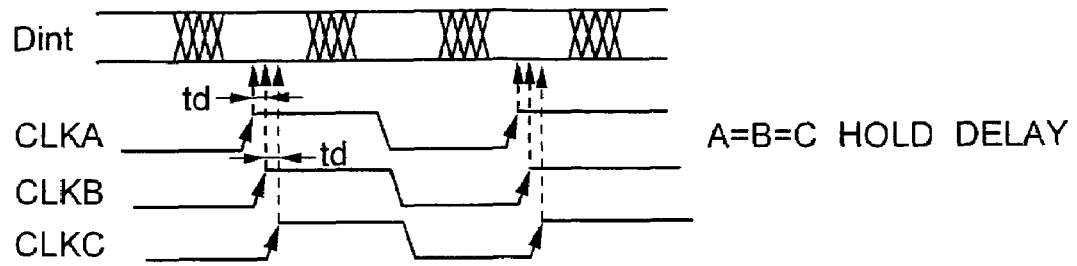
FIGS. 2A through 2C are timing charts showing the phase relationship between a data signal and a clock signal.
Figure 2B:
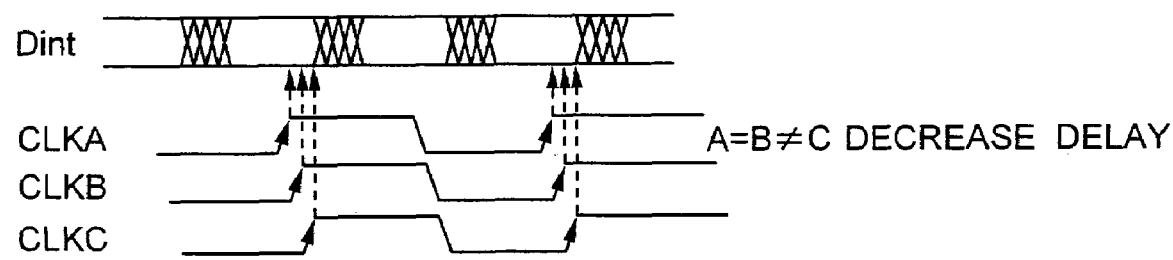
Figure 2C:
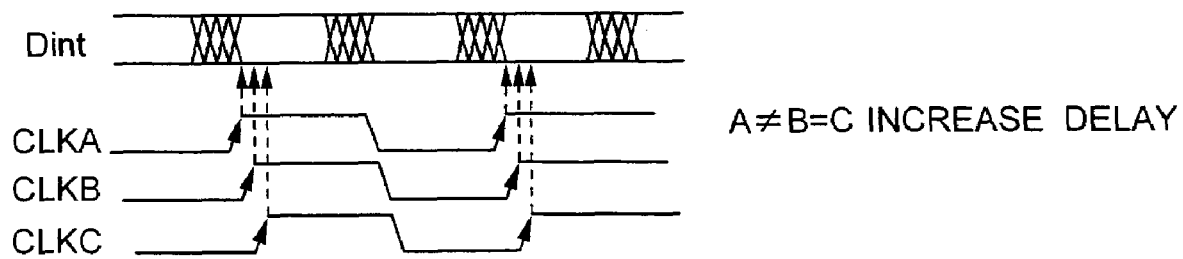

FIGS. 2A through 2C illustrate timing charts showing the different cases for the phase relationship between the data signal and the clock signals A, B and C. For instance, the frequency of a data strobe signal is 500 MHz and the data rate of the data signal Dint is 1 Gbps. The delay time td of the delay gates 108 is typically set at not greater than 50 psec, which is 1/20 of the data rate because 1 Gbps corresponds to 1 nsec. From the viewpoint of the second clock signal CLKB, the phase of the first clock signal CLKA leads by td from the phase of the second clock signal CLKB, whereas the phase of the third clock signal CLKC lags by td behind the phase of the second clock signal CLKB.

The phase of the data signal Dint output from input amplifier 102 has a significant range of variation, and the data switching timing fluctuates in a certain range. If the data signal Dint and each of the clock signals A, B and C have a phase relationship as illustrated in FIG. 2A, the data signal does not change in the interval from the rising edge of the first clock signal CLKB to the corresponding rising edge of the third clock signal CLKC and hence the output signals A, B and C of the flip-flops 104 through 106 have the same data, i.e., A=B=C. It is not necessary to change the delay time of the delay adjustment circuit 103 in this case. Thus, the judging circuit 107 maintains the current delay time of the delay adjustment circuit 103 when it judges that A=B=C.

If the data signal Dint and each of the clock signals have a phase relationship as illustrated in FIG. 2B, the third clock signal CLKC rises after the data switching timing of the data signal Dint, and hence the signals A and B output from the first and second flip-flops 104, 105, respectively, have the same data, whereas the signal C output from the third flip-flop 106 does not agree with the signals A and B, i.e., A=B≠C. The delay time of the delay adjustment circuit 103 is excessively long in this case. Thus, the judging circuit 107 shortens the current delay time if it judges that A=B≠C.

If the data signal Dint and each of the clock signals have a phase relationship as illustrated in FIG. 2C, the first clock signal CLKB rises before the data switching timing of the data signal Dint, and hence the signals B and C output from the second and third flip-flops 105, 106, respectively, have the same data whereas the signal A output from the first flip-flop 104 does not agree with the signals B and C, i.e., A≠B=C. The delay time of the delay adjustment circuit 103 is excessively short in this case. Thus, the judging circuit 107 prolongs the current delay time if it judges that A≠B=C.

If the delay time td of the delay gates 108 is set at not greater than 1/20 of the data period, it is hardly assumed that the output signal A of the flip-flop 104 and the output signal B of the flip-flop 105 have different data and the output signal B of the flip-flop 105 and the output signal C of the flip-flop 106 have also different data, i.e., A≠B≠C. However, if such a state is detected, it may suggest some abnormal condition. For instance, one of the flip-flops may not be operating properly and may output a fixed value. Therefore, when the judging circuit 107 judges that A≠B≠C, the judging circuit sets a flag on a register that can be externally referred to, thereby indicating occurrence of an abnormal situation, and outputs an alarm. Thus, with this arrangement, an external memory controller, for example, can detect that an abnormal situation has occurred in the memory device 100.

Figure 3:
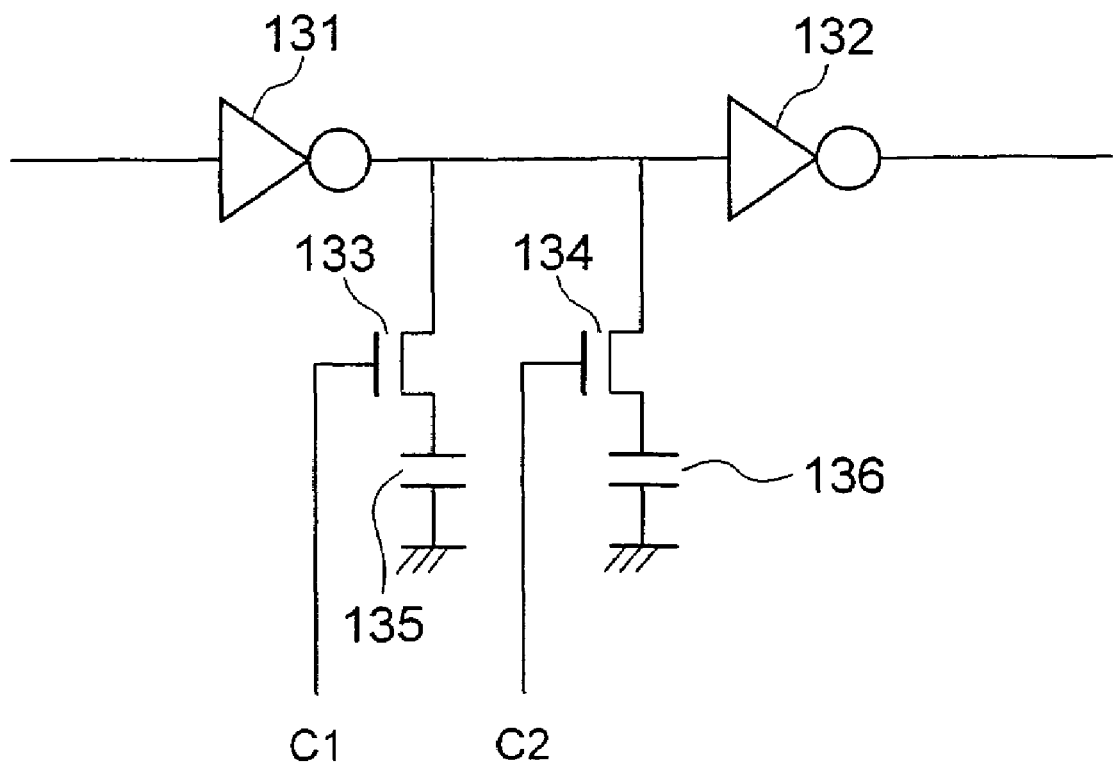
FIG. 3 is a schematic circuit diagram of the delay adjustment circuit 103 of the embodiment, showing an exemplary configuration thereof.

FIG. 3 is a schematic circuit diagram of the delay adjustment circuit 103 of the embodiment of FIG. 1, showing an exemplary configuration thereof. The delay adjustment circuit 103 has two inverters 131, 132, two transistors 133, 134 and two capacitors 135, 136. The transistors 133, 134 are controlled by control signals C1, C2, respectively, from the judging circuit 107 for ON/OFF so as to control the connections between the output of the inverter 131 (the input of the inverter 132) and the capacitors 135, 136. Thus, with this arrangement, the output load capacitance of the inverter 131 (the input load capacitance of the inverter 132) changes to change the delay time of the delay adjustment circuit 103. In the illustrated instance, the delay time of the delay adjustment circuit 103 can be controlled so as to select one of three steps including a condition where only the capacitor 135 or 136 is connected (delay "intermediate"), a condition where both of the capacitors 135 and 136 are connected (delay large") and a condition where neither the capacitor 135 nor the capacitor 136 is connected (delay "small").

In the initial state, the judging circuit 107 allows the control signal C1 to assume "0" (L: Low) and control signal C2 to assume "1" (H: High) to turn only the transistor 134 ON and connect only the capacitor 136 to the output of the inverter 131, so as to control the delay time of the delay adjustment circuit 103 thereby allowing the delay time to assume delay "intermediate". If the judging circuit 107 judges that "A=B=C" (FIG. 2A) in this state, the judging circuit 107 maintains the value of the control signal C1 and that of the control signal C2 which assume "0" and "1", respectively, and also the delay time of the delay adjustment circuit 103 that assumes delay "intermediate".

If, on the other hand, the judging circuit 107 judges that "A=B≠C (FIG. 2B), the judging circuit 107 allows both the value of the control signal C1 and that of the control signal C2 to assume. "0" (L) to turn both the transistor 133 and the transistor 134 OFF. As a result, the delay time of the delay adjustment circuit 103 changes from delay "intermediate" to delay "small". If, finally the judging circuit 107 judges that A≠B=C, the judging circuit 107 allows both the value of the control signal C1 and that of the control signal C2 to assume "1" (H) to turn both the transistor 133 and the transistor 134 ON. As a result, the delay time of the delay adjustment circuit 103 is changed from delay "intermediate" to delay "large".

The judging circuit 107 controls the delay time of the delay adjustment circuit 103 in the manner as described above based on the result of comparing the output signals A, B and C of the flip-flops 104 through 106. Thus, it is possible to improve the hold time by reducing the delay time and bringing the data fetching timing close to the state shown in FIG. 2A when the delay time of the data strobe signal DQS is large and the hold time is excessively short as shown in FIG. 2B, whereas it is possible to improve the setup time by prolonging the delay time and bringing the data fetching timing close to the state shown in FIG. 2A when the delay time of the data strobe signal DQS is small and the setup time is excessively short as shown in FIG. 2C.

Thus, in the present embodiment, the data signal Dint is latched at one of three different timings by means of the flip-flops 104 through 106 and the judging circuit 107 judges the result of the latching and adjusts the delay time of the delay adjustment circuit 103 based on the result. With this arrangement, it is possible to suitably adjust the phase relationship between the data strobe signal and the data signal and maintains the setup time and the hold time to an appropriate level. Additionally, since the phase adjustment can be performed only at the side of the memory device 100 that is the data receiving side, it is not necessary to provide the memory controller, which is the data transmitting side, with a specific additional circuit. Thus, the delay time can be adjusted with ease when transmitting a data from the side of the memory controller.

The adjustment for the variable delay time of the delay adjustment circuit 103 by the judging circuit 107 may be performed at the timing of initialization when the power supply switch is turned on for the memory device 100. In such a case, a command is issued at the time of initialization to activate the judging circuit 107, so as to input the data signals that are sequentially inverted from the data transmitting side and adjust the delay time of the delay adjustment circuit 103. Thereafter, the judging circuit 107 is deactivated. When the memory device 100 is set in a normal operation, the delay time of the delay adjustment circuit 103 that is adjusted at the time of initialization is maintained.

In an alternative, the delay time of the delay adjustment circuit 103 may be adjusted constantly to dynamically adjust the phase relationship between the data strobe signal and the data signal. In a further alternative, the judging circuit 107 may be activated periodically with a period longer than the clock period of the data strobe signal to adjust the delay time of the delay adjustment circuit 103 intermittently. The arrangement of activating the judging circuit 107 only at the time of initialization or activating the judging circuit 107 intermittently provides the advantage of reducing the operating current as compared with the arrangement of constantly activating the judging circuit 107.

Figure 4:
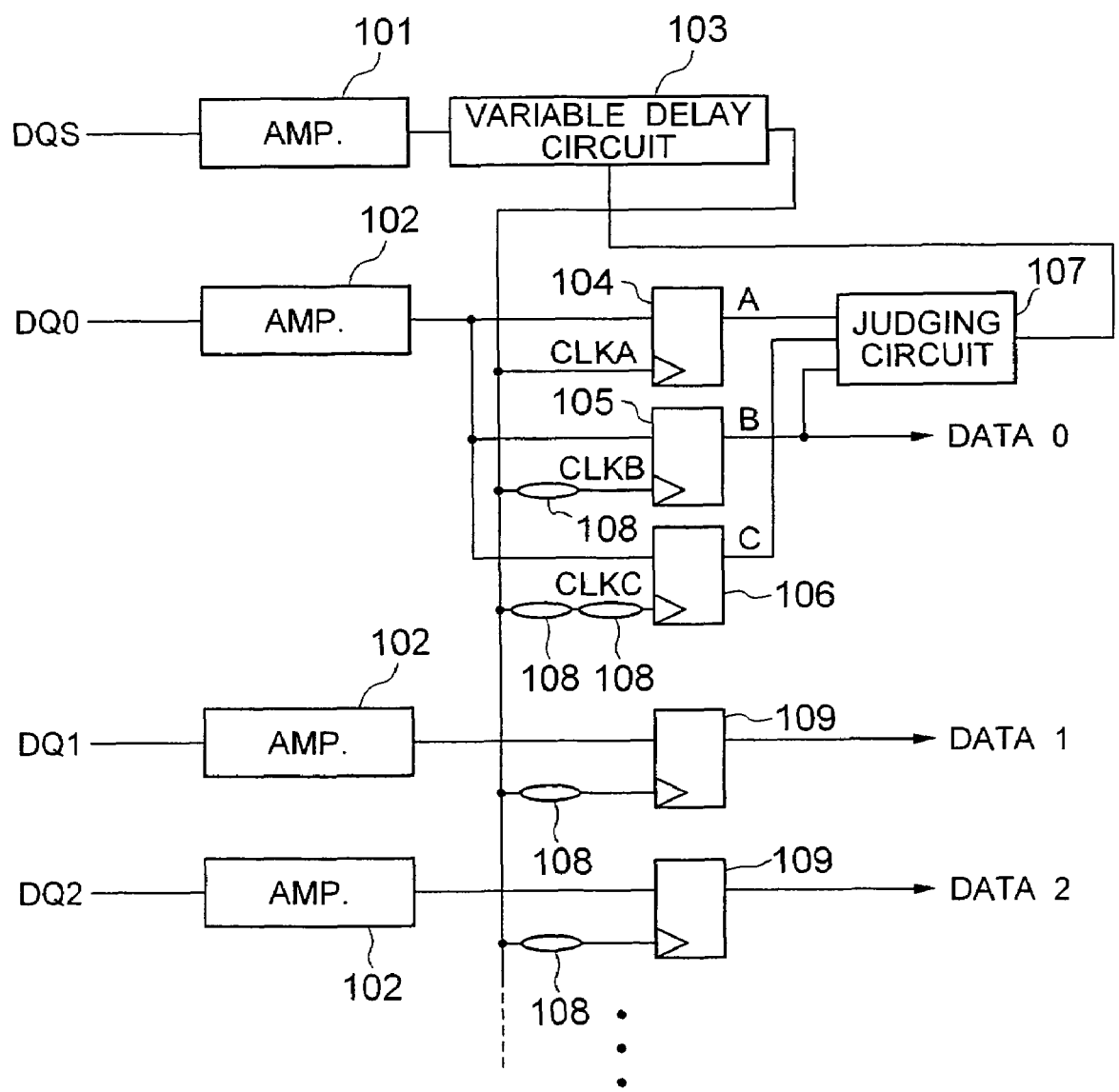
FIG. 4 is a schematic block diagram of a semiconductor device according to a modification of the embodiment.
Figure 5:
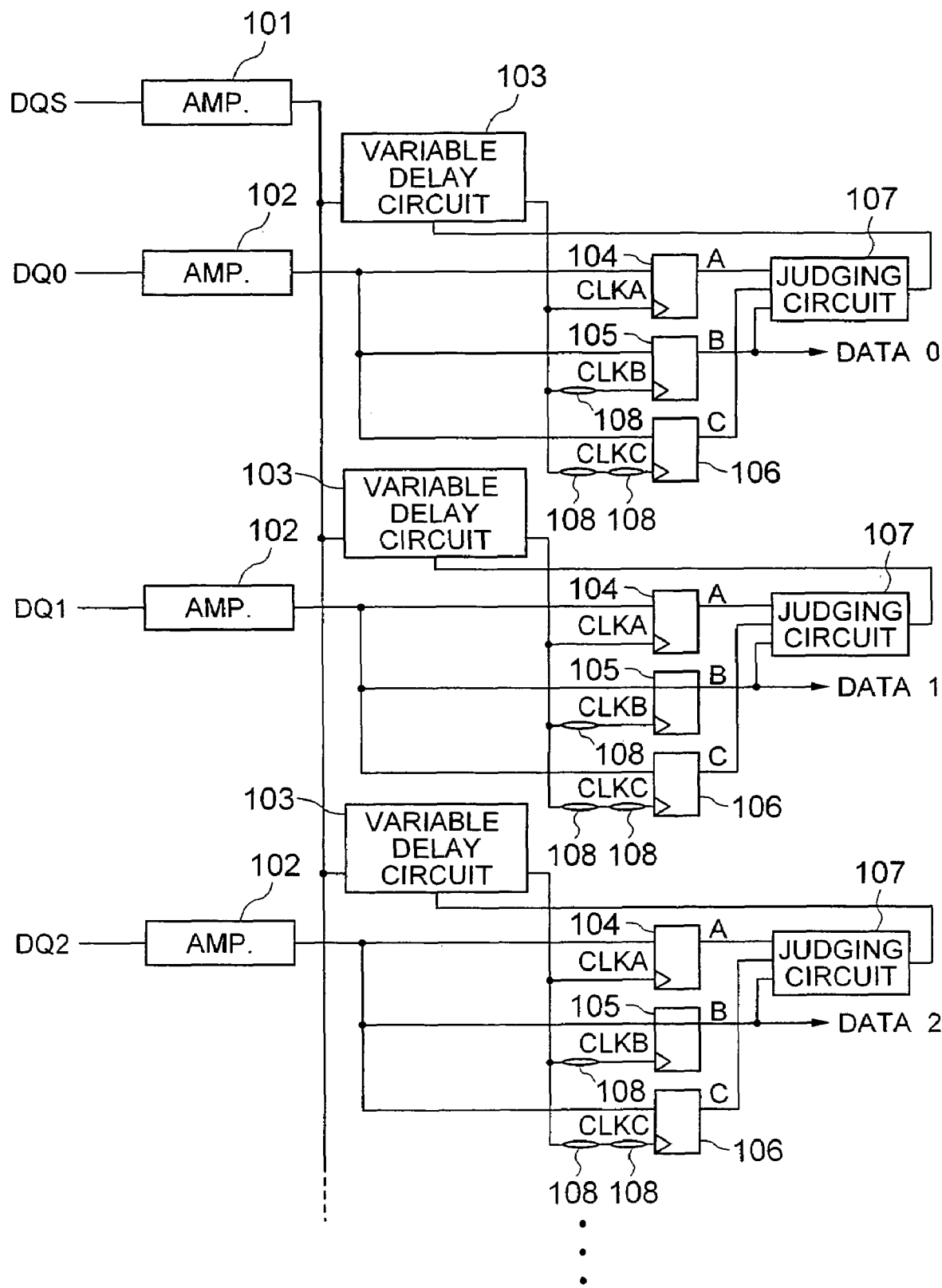
FIG. 5 is a schematic block diagram of a semiconductor device according to another modification of the embodiment.

If a plurality of data terminals are provided in the timing adjustment circuit, it is possible to arrange a single delay adjustment circuit 103 and supply therefrom a common data strobe signal to all the flip-flops that latch the data of the respective data terminals, as shown in FIG. 4. In such a case, as shown in FIG. 4, the flip-flops 104 through 106 and the judging circuit 107 are arranged to correspond to data signal supplied through data terminal DQ0, for example, and adjust the delay time of the delay adjustment circuit 103 based on the result of judgment on the data signal supplied through data terminal DQ0. The data strobe signal output from the delay adjustment circuit 103 is input in common to a plurality of flip-flops 109 which respectively latch the data signals supplied through data terminals DQ1, DQ2, . . . . In an alternative, as shown in FIG. 5, the delay adjustment circuit 103, flip-flops 104 through 106 and judging circuit 107 may be arranged to correspond to each of the data terminals DQ0, DQ1, DQ2, . . . , and the phase relationship between the data signal and the strobe signal may be adjusted for each of the data terminals DQ0, DQ1, DQ2, . . . by individually adjusting the delay time of the delay adjustment circuit 103.

Figure 6:
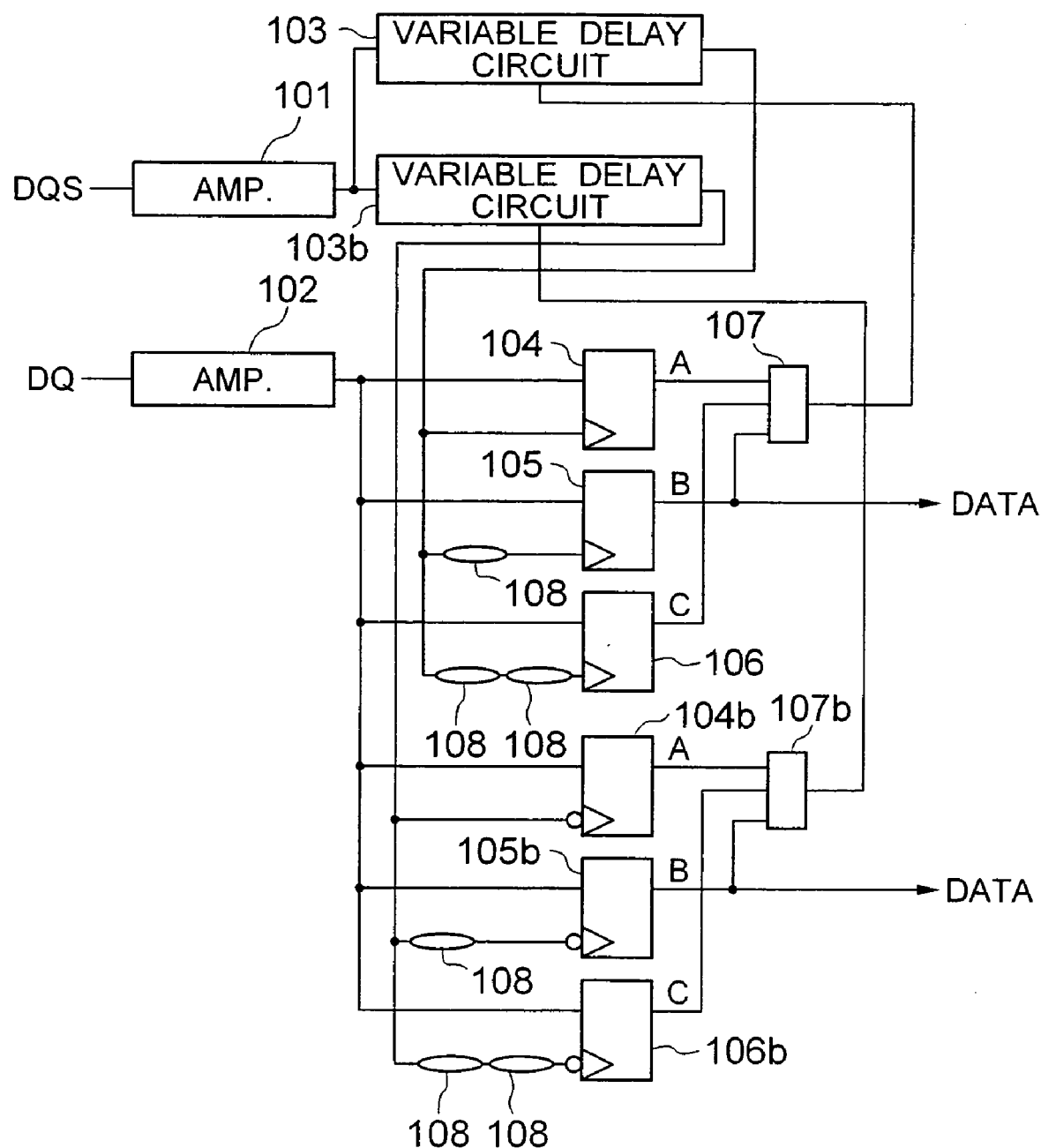
FIG. 6 is a schematic block diagram of part of a semiconductor device including the timing adjustment circuit of an embodiment of the present invention.

Although the phase relationship between the rising edge of the data strobe signal and the data signal is adjusted in the embodiment of FIG. 1, it is preferable to also adjust the phase relationship between the falling edge of the data strobe signal and the data signal at the falling edge in the case of a memory device adapted to latch a data at the falling edge of the data strobe signal, such as in a DDR DRAM device. If such is the case, as shown in FIG. 6, a delay adjustment circuit 103 for the falling edge, flip-flops 104b through 106b for inputting inverted signals of the data strobe signal to the clock terminal and a judging circuit 107 for the falling edge are provided, in addition to those for the rising edge. Thus, the phase relationship between the falling edge of the data strobe signal and the data signal is additionally adjusted, by adjusting the delay time of the delay adjustment circuit 103b by means of an additional judging circuit 107b.

Figure 7:
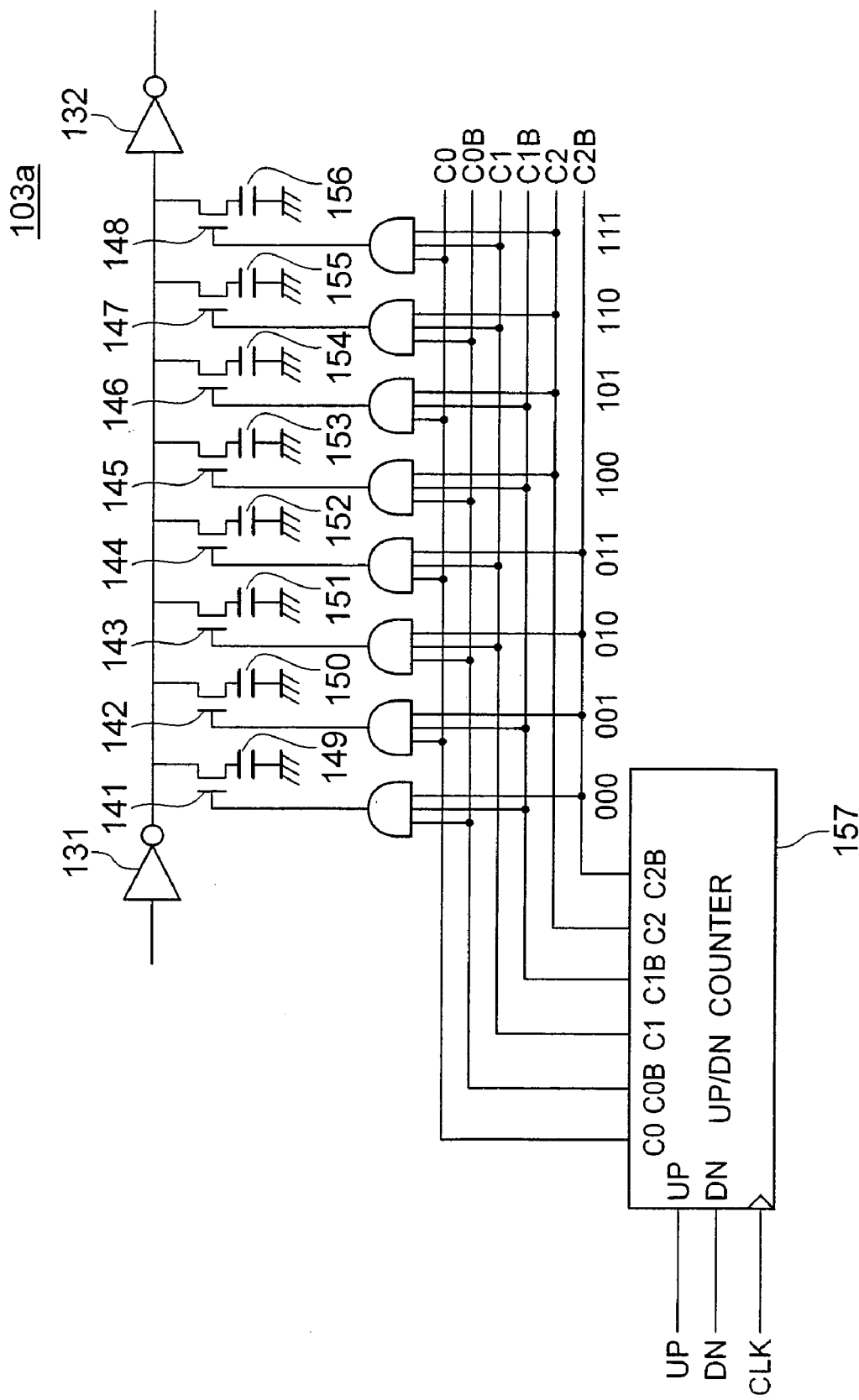
FIG. 7 is a schematic circuit diagram of an alternative delay adjustment circuit.
Figure 8:
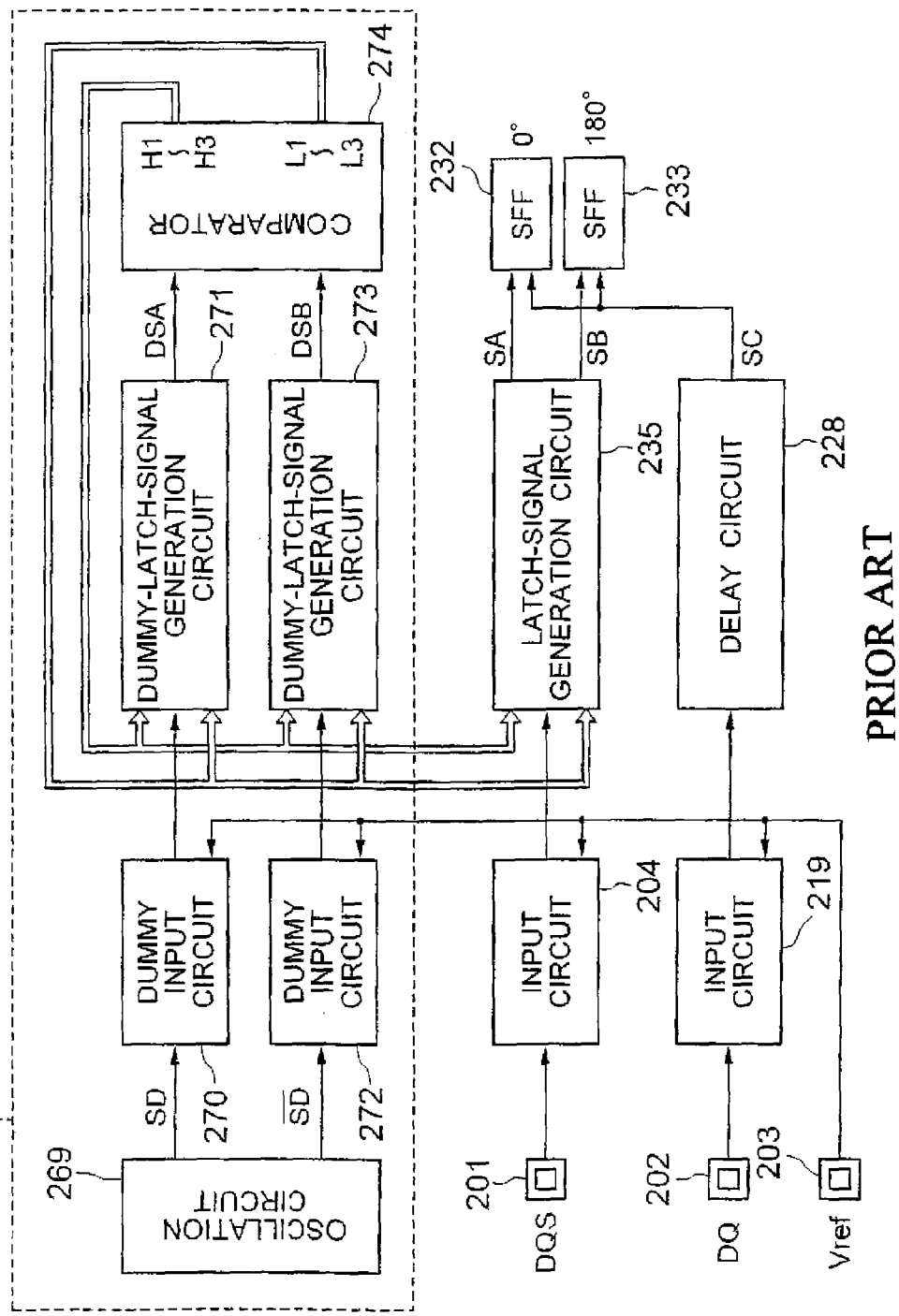
FIG. 8 is a schematic block diagram of a conventional semiconductor integrated circuit.
Figure 9:
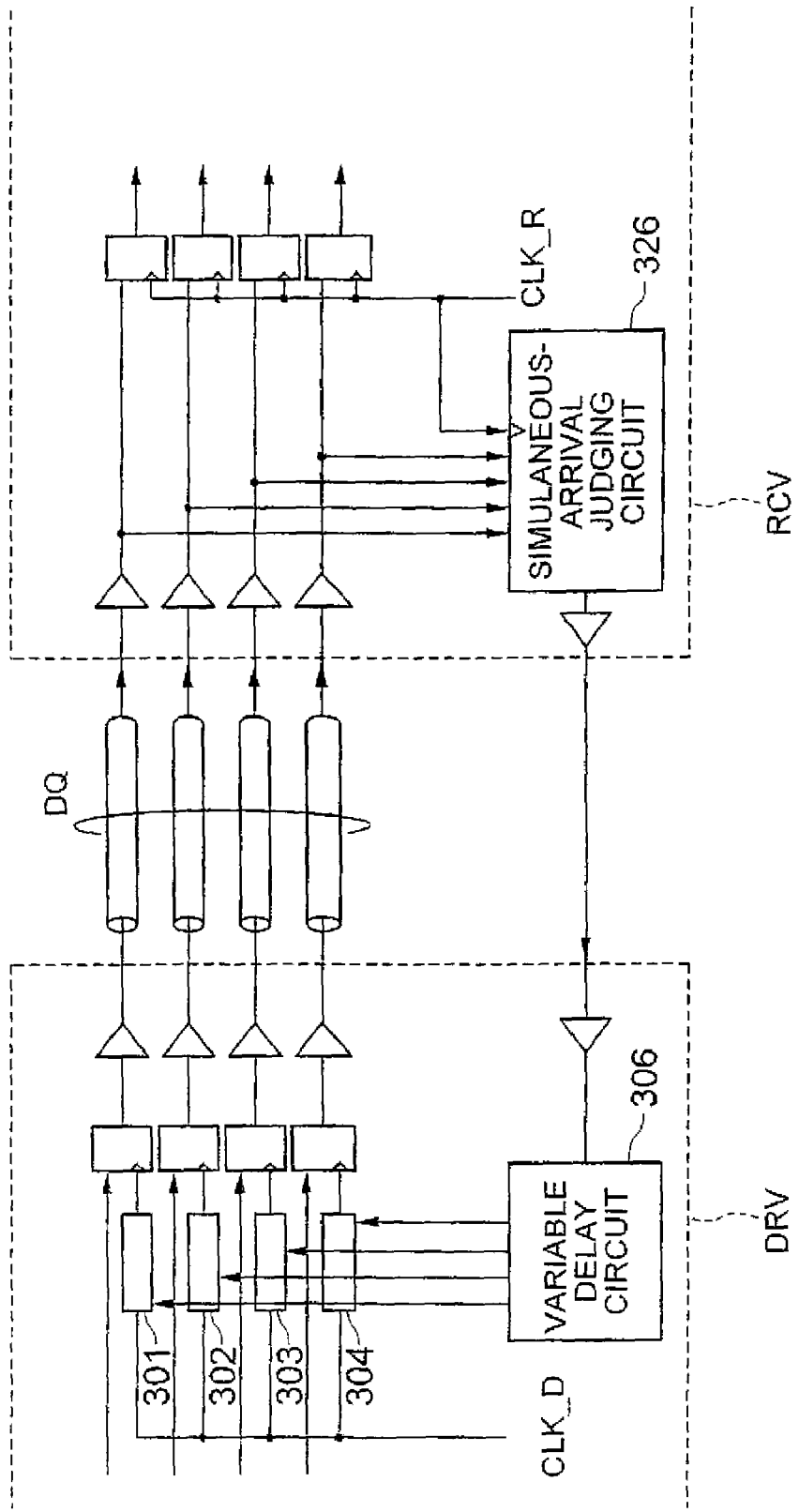
FIG. 9 is a schematic block diagram of a conventional signal transmission system.

While the number of steps of adjustment for the delay time in the delay adjustment circuit 103 is three including delay "small", delay intermediate" and delay "large" in the instance of FIG. 3, the number of steps of adjustment may be increased. FIG. 7 is a schematic circuit diagram of an alternative delay adjustment circuit 103a that can be used for the timing adjustment circuit of the present invention.

Referring to FIG. 7, delay adjustment circuit 103a has eight transistors 141 through 148 and eight capacitors 149 through 156, wherein the connections of the capacitors 149 through 156 are controlled based on the output of an UP/DN (UP/DOWN) counter 157. An internal CLK signal and a count-down signal (DN) and a count-up signal (UP) output from the judging circuit 107 (FIG. 1) are input to the UP/DN counter 157. The internal CLK signal can be generated from CK/CKB in the case of a DDR DRAM device.

The UP/DN counter 157 is formed as a 3-bit counter and adapted to output C0 through C2 and inverted signals C0B through C2B thereof. One of the transistors 141 through 148 is turned on and the corresponding one of the capacitors 149 through 156 is connected to the output of the inverter 131 based on the output value of the UP/DN counter 157. The UP/DN counter 157 controls the capacitors 149 through 156 to control the delay time such that the delay time is smallest if the counter reading is "000" (C2, C1, C0) to connect capacitor 149 to the output of the inverter 131, such that the delay time is largest if the counter reading is "111" to connect capacitor 156 to the output of the inverter 131, and such that the delay time monotonically increases or decreases according to the count up or count down of the UP/DN counter 157.

When the judging circuit 107 FIG. 1) judges that A=B=C (FIG. 2A), the judging circuit 107 inputs neither count-up signal UP nor count-down signal DN to the delay adjustment circuit 103a and the reading of the UP/DN counter 157 is maintained. As a result, the delay time of the delay adjustment circuit 103a is held unchanged. When the judging circuit 107 judges that A=B≠C (FIG. 2B), the judging circuit 107 inputs count-down signal DN to the delay adjustment circuit 103 and the reading of the UP/DN counter 157 is decremented by one. If, for instance, the reading of the UP/DN counter is "100" and capacitor 153 is connected, the reading of the UP/DN counter assumes "011" so that the delay time of the delay adjustment circuit 103a is reduced because capacitor 152 is connected. If the judging circuit 107 further judges that "A=B≠C in this situation, the reading of the UP/DN counter 157 is decremented again to assume "010" so that capacitor 151 is connected to further reduce the delay time of the delay adjustment circuit 103a.

When, on the other hand, the judging circuit 107 judges that A≠B=C (FIG. 2C), the judging circuit 107 inputs a count-up signal UP to the delay adjustment circuit 103 and the reading of the UP/DN counter 157 is incremented by one. If, for instance, the reading of the UP/DN counter is "100" and capacitor 153 is connected, the reading of the UP/DN counter 157 assumes "101" so that the delay time of the delay adjustment circuit 103a is increased because capacitor 154 is connected. If the judging circuit 107 further judges that A≠B=C in this condition, the reading of the UP/DN counter 157 is incremented again to assume "110" so that capacitor 155 is connected to further increase the delay time of the delay adjustment circuit 103a. Thus, it is possible to finely control the delay time of the delay adjustment circuit 103a by controlling the delay time with a plurality of steps by means of an UP/DN counter 157 in the above described manner.

When the judging circuit 107 judges that A≠B≠C, the judging circuit 107 sets a flag to indicate occurrence of an abnormal situation and outputs an alarm in the above-described embodiment. However, the present invention is not limited to such a configuration. In an alternative, for example, an output pin may be provided to output a signal that indicates an abnormal situation and the output pin may delivers an alarm signal. In another alternative, the memory device 100 may be provided with a test circuit that is adapted to output the result of the judgment of the judging circuit 107, such as A=B=C, or the occurrence of an abnormal situation by way of a specific DQ pin or a dedicated output pin when a test mode is selected. With any of these alternative arrangements, it is possible to detect the abnormal situation by means of an external controller.

As described above, in accordance with the timing adjustment circuit of the above embodiment, if the setup time and hold time for the data signal with respect to the external timing signal are not suitably determined for latching, the timing adjustment circuit in the data receiving semiconductor device can correctly latch or fetch the data signal.

It is preferable in the present invention that the variable delay circuit adjust the variable delay time in at least three delay steps for adjustment.

It is also preferable that the first delay time be equal to half the second delay time.

It is also preferable that the judging circuit maintain a current variable delay time of the variable delay circuit if the output data of the first through third latch circuits coincide with one another.

It is also preferable that the judging circuit increase a current variable delay time of the variable delay circuit if the output data of second latch circuit coincides with the output data of the third latch circuit and differs from the output data of the first latch circuit, and decrease the current variable delay time of the variable delay circuit if the output data of second latch circuit differs from the output data of the third latch circuit and coincides with the output data of the first latch circuit It is also preferable that the variable delay circuit includes an UP/DOWN counter having at least three count readings, and a variable delay gate having the variable delay time which is increased or decreased in response to a count up or count down of the UP/DOWN counter.

It is also preferable that the judging circuit generate an alarm if the output data of the second latch circuit differs from both the output data of the first and third latch circuits. It is also preferable that the semiconductor device includes a plurality of data terminals each receiving a corresponding one of a plurality of the data signal, and a plurality of the variable delay circuit each disposed for a corresponding one of the data terminals.

It is preferable in the semiconductor device of the present invention that the semiconductor device include a plurality of data terminals each receiving a corresponding one of a plurality of the data signal, and that the variable delay circuit be disposed for one of the data terminals.

While the present invention is described above by way of a preferred embodiment, a timing adjustment circuit and a semiconductor device according to the present invention are by no means limited thereto and the embodiment may be modified in various different ways without departing from the spirit and scope of the invention.

What is claimed is:

1. A timing adjustment circuit for controlling timing for latching a data signal based on an external timing signal, said timing adjustment circuit comprising:
    a variable delay circuit for delaying said external timing signal by a variable delay time to generate a delayed timing signal;
    a first latch circuit for latching said data signal based on a first clock signal having a specific phase relationship with respect to said delayed timing signal;
    a second latch circuit for latching said data signal based on a second clock signal having a first delay time with respect to said first clock signal;
    a third latch circuit for latching said data signal based on a third clock signal having a second delay time with respect to said first clock signal, said second delay time being larger than said first delay time; and
    a judging circuit for comparing output data of said first through third latch circuits among each other, to control said variable delay time based on a result of comparison.

2. The timing adjustment circuit according to claim 1, wherein said variable delay circuit adjusts said variable delay time in at least three delay steps for adjustment.

3. The timing adjustment circuit according to claim 1, wherein said first delay time is equal to half said second delay time.

4. The timing adjustment circuit according to claim 1, wherein said judging circuit maintains a current variable delay time of said variable delay circuit if said output data of said first through third latch circuits coincide with one another.

5. The timing adjustment circuit according to claim 1, wherein said judging circuit increases a current variable delay time of said variable delay circuit if said output data of second latch circuit coincides with said output data of said third latch circuit and differs from said output data of said first latch circuit, and decreases the current variable delay time of said variable delay circuit if said output data of second latch circuit differs from said output data of said third latch circuit and coincides with said output data of said first latch circuit.

6. The timing adjustment circuit according to claim 5, wherein said variable delay circuit includes an UP/DOWN counter having at least three count readings, and a variable delay gate having said variable delay time which is increased or decreased in response to a count up or count down of said UP/DOWN counter.

7. The timing adjustment circuit according to claim 1, wherein said judging circuit generates an alarm if said output data of said second latch circuit differs from both said output data of said first and third latch circuits.

8. A semiconductor device comprising the timing adjustment circuit according to claim 1, and an internal circuit for receiving said output data of said second latch circuit.

9. The semiconductor device according to claim 8, wherein said semiconductor device includes a plurality of data terminals each receiving a corresponding one of a plurality of said data signal, and a plurality of said variable delay circuit each disposed for a corresponding one of said data terminals.

10. The semiconductor device according to claim 8, wherein said semiconductor device includes a plurality of data terminals each receiving a corresponding one of a plurality of said data signal, and wherein said variable delay circuit is disposed for one of said data terminals.

11. A semiconductor device comprising a data terminal, a first timing adjustment circuit configured by the timing adjustment circuit according to claim 1, and a second timing adjustment circuit configured by the timing adjustment circuit according to claim 1, wherein said first timing adjustment circuit latches a first data signal based on a rising edge of said external timing signal and said second timing adjustment circuit latches a second data signal based on a falling edge of said external timing signal.

* * * * *